United States Patent [19]

Sato et al.

[11] 4,089,021

[45] May 9, 1978

[54] SEMICONDUCTOR DEVICE CAPABLE OF WITHSTANDING HIGH VOLTAGE AND METHOD OF MANUFACTURING SAME

[75] Inventors: Naonobu Sato; Kaoru Shinnou, both of Kodaira, Japan

[73] Assignee: Hitachi, Ltd., Japan

[21] Appl. No.: 747,323

[22] Filed: Dec. 3, 1976

[30] Foreign Application Priority Data

Dec. 8, 1975 Japan .................. 50-145041

[51] Int. Cl.$^2$ ............. H01L 29/06; H01L 29/72; H01L 27/02; H01L 27/04
[52] U.S. Cl. .................. 357/20; 357/34; 357/40; 357/50; 357/55
[58] Field of Search ............ 357/20, 34, 40, 50, 357/55

[56] References Cited

U.S. PATENT DOCUMENTS 3,993,512  11/1976  Encinas .................. 357/48

*Primary Examiner*—Edward J. Wojciechowicz
*Attorney, Agent, or Firm*—Craig & Antonelli

[57] ABSTRACT

A semiconductor device capable of withstanding a high voltage and a method of manufacturing same in which the device comprises a semiconductor substrate having its major surface provided with one or more recessed or dish-shaped portions, a buried region formed in the surface of the dish-shaped portions of the substrate, an epitaxial layer grown all over the major surface of the substrate and having a plain surface, one or more isolation regions formed, for example, by anisotropic etching in the epitaxial layer so as to extend from the surface of the epitaxial layer to reach that portion of the major surface of the substrate which is not recessed to define one or more dish-shaped islands in the epitaxial layer, and active regions formed in the dish-shaped islands.

11 Claims, 31 Drawing Figures

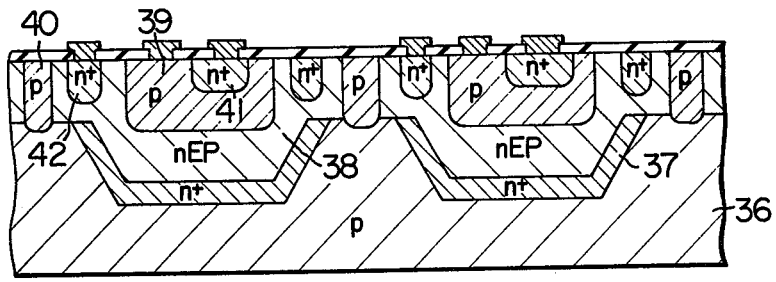
FIG. 5
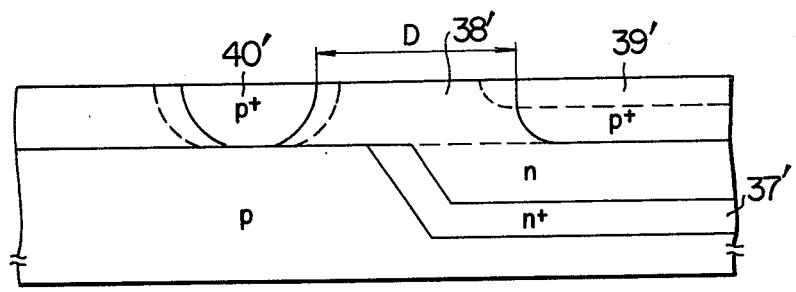
FIG. 6

FIG. 8
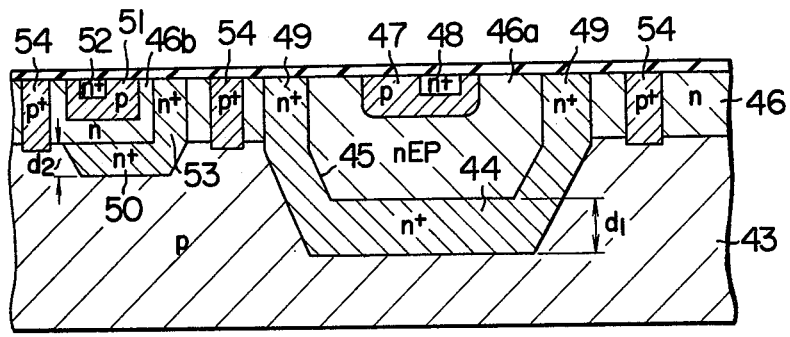

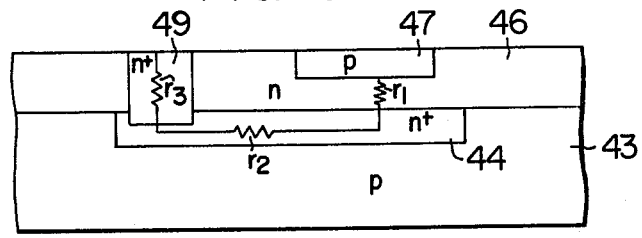
FIG. 9
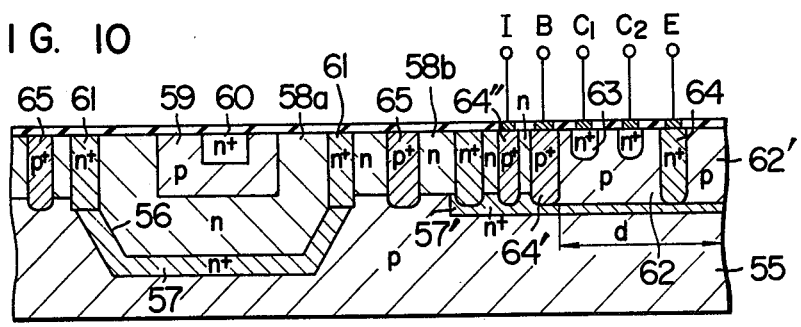
FIG. 10
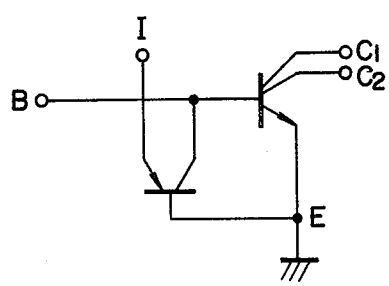
FIG. 11
FIG. 12 PRIOR ART
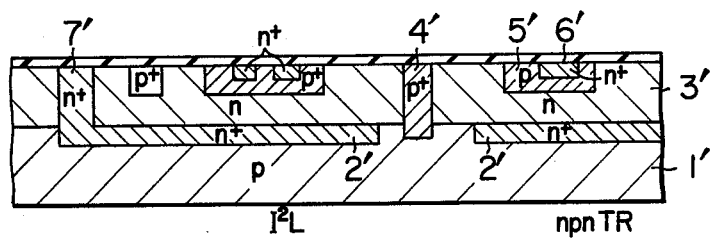

SEMICONDUCTOR DEVICE CAPABLE OF WITHSTANDING HIGH VOLTAGE AND METHOD OF MANUFACTURING SAME

The present invention relates in general to a semiconductor device, particularly a linear semiconductor integrated circuit device, which is capable of withstanding a high voltage and a method of manufacturing same.

In the hitherto known IC structure including bipolar transistors, when a semiconductor substrate in which devices, being isolated by isolation regions from one another, are formed is large in thickness, the isolation regions will be necessarily expanded laterally, providing an obstacle to the enhancement of the integration density of the IC, as will be discussed hereinafter. On the other hand, resignation of the attempt to increase the thickness of the semiconductor substrate from the viewpoint of the integration density will be necessarily accompanied with a reconciliation that the withstanding voltage of the resulting device has to be restricted to lower than a predetermined level, which in turn makes it difficult to obtain IC devices capable of withstanding a high voltage.

Accordingly, an object of the present invention is to provide a semiconductor device capable of withstanding a high voltage which can be manufactured through a conventional process such as a diffusion technique.

Another object of the invention is to provide an integrated circuit device having an increased integration density.

Still another object of the invention is to provide a semiconductor integrated circuit device which can be implemented in various configurations without incurring increase in the number of the manufacturing steps.

The above and other objects, features and advantages so the invention will become more apparent from the detailed description of preferred embodiments of the invention in conjunction with the accompanying drawings, in which:

FIG. 5 shows in sectional view semiconductor device according to another embodiment of the invention;

FIG. 6 is a fragmental view of FIG. 5 to illustrate expansion of diffusion regions;

FIG. 8 is a sectional view showing a semiconductor device according to another embodiment of the invention;

FIG. 9 is a view illustrating collector series resistances in the embodiment shown in FIG. 8;

FIG. 10 shows in a sectional view of a semiconductor device according to another embodiment of the present invention;

FIG. 11 is an equivalent circuit diagram of the structure shown in FIG. 10;

FIG. 12 is a sectional view of a semiconductor device corresponding to the circuit arrangement shown in FIG. 11 but manufactured in accordance with a prior art manufacturing technique;

Figure 1:
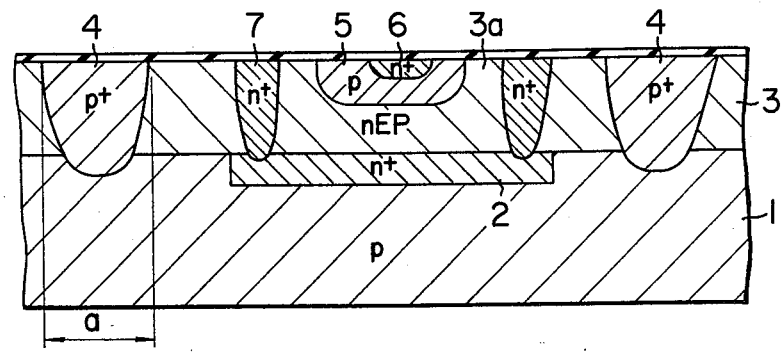
FIG. 1 is a fragmental sectional view showing a hitherto known integrated circuit device including bipolar transistors.

Before entering into detailed description of the invention, a semiconductor device according to the prior art such as disclosed in, for example, U.S. Pat. No. 3,380,153 issued on Apr. 30, 1968 and assigned to Westinghouse Electric Corporation will be first described with reference to FIG. 1 for a better understanding of the invention. The semiconductor device comprises a silicon substrate 1 of p-conductivity type which includes an $n^+$-type buried region 2 through selective diffusion of an n-type impurity into the substrate 1. An epitaxially grown layer 3 of n-conductivity type is formed on the surface of the substrate 1 as well as on the region 2 to an appropriate thickness. An isolation region 4 of $p^+$-type is formed in the epitaxial layer 3 by diffusing a p-type impurity so as to enclose a region 3a overlying the $n^+$-type buried region 2. There are formed in the region 3a a $p^+$-type base region 5, $n^+$ type emitter region 6 and $n^+$-type collector leading region 7 in constant with the $n^+$-type buried region 2 through impurity diffusion.

With such arangement, however, the thickness of the epitaxial layer 3 is restricted to a small value in the order of $20\mu$ to $30\mu$ for the reasons described later, and therefore a semiconductor device of the above structure is unsuited to make a device or element for use with a high voltage such as a power transistor, a power diode or the like.

If the thickness of the epitaxial layer 3 is larger, it takes a lot of time for forming through the impurity diffusion the isolation layer 4 which extends to reach the substrate 1 from the upper surface of the epitaxial layer 3, resulting in greater lateral expansion of the isolation region 4 as indicated by a. Additionally, diffusion of impurity from the $n^+$-type buried layer 2 into the epitaxial layer 3a or so-called "out diffusion" takes place during the diffusion of impurities into the epitaxial layer 3, which brings about a decrease in the collector resistance value. To avoid such inconveniencies, it is known to employ an impurity having a relatively small diffusion coefficient such as Sb, As or the like. However, such a measure has encountered a limitation. Besides, when a plurality of elements of various types and/or having different characteristics have to be formed in a single silicon substrate, the manufacturing process therefor becomes much complicated with the number of processing steps as well as costs also being increased, since the depths of diffusion at various layers or regions are required to vary in accordance with the individual different elements to be implemented.

The problems of the hitherto known semiconductor device described above can be successfully solved according to the invention. An anistropic etching technique may be employed in carrying out the invention.

Now, some preferred embodiments of the invention will be described in detail.

EMBODIMENT 1

FIGS. 2a to 2h show a fundamental embodiment of a semiconductor device according to the invention and illustrate arrangements and configurations of individual constituents of the device at selected manufacturing steps by taking an example of the case in which an npn-transistor of a high rated voltage is formed in a p-type silicon substrate.

Figure 2A:
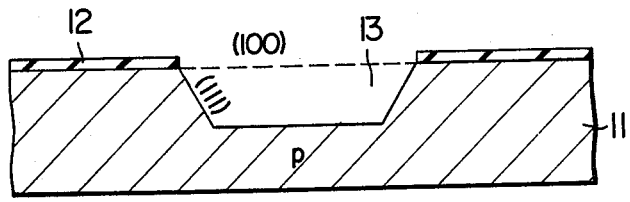
FIGS. 2a to 2h are sectional views showing various steps of the manufacture of a semiconductor device according to an embodiment of the invention.

At the step a shown in FIG. 2a, a single crystal silicon substrate 11 of p-conductivity type having a high resistivity is prepared with the crystal plane (100) used as the major surface. The surface of the p-type substrate 11 is oxidized to form an oxide film ($SiO_2$), from which an oxide film mask 12 is formed through a series of photo-etching processes including application of photoresist, exposure, development treatment, etching for forming windows or the like. With the aid of the thus formed oxide mask 12, an anistropic etching of the silicon substrate 11 is carried out to form a dish-shaped portion 13 in the surface of the substrate 11. It has been experimentally found that the anisotropic etching which is effected by using an alkaline etchant such as a 40% solution of KOH with respect to the silicon crystal plane (100) allows formation of the dish-shaped portion 13 having a flat bottom extending along the crystal plane (100) and a steeply inclined wall rapidly within a short time, because the etching rate in a direction perpendicular to the silicon crystal plane (100) is remarkably high as compared with the etching rate in a direction perpendicular to the other crystal planes such as the (111) plane (the ratio of the former to the latter is about 50 to 1), when an alkaline etchant such as KOH or NaOH is used. In reality, it is possible to form a dish-shaped portion of 10 to 30$\mu$ in depth with an etching rate of 1$\mu$/min through the anisotropic etching process. Of course, usual etching processes may be employed in place of the anisotropic etching ones.

Figure 2B:
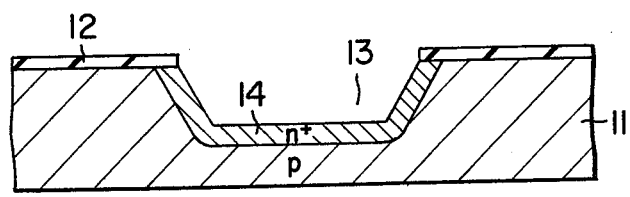

At the step b shown in FIG. 2b, with the oxide film mask 12 retained a donor impurity such as antimony (Sb) or arsenic (As) is deposited and subsequently diffused into the exposed portion of the substrate 11, i.e., into the surface portion of the dish-shaped portion 13 thereby to form an n$^+$-type diffusion region 14 in the surface of the dish-shaped portion 13. The n$^+$-type diffused region 14 thus formed and having a low resistivity constitutes an buried region below an epitaxial layer to be formed at a subsequent step and serves as a collector region.

Figure 2C:
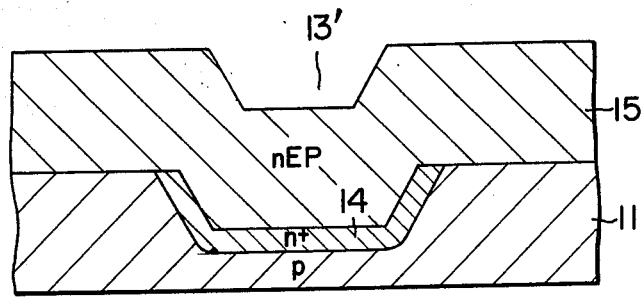

At the step c shown in FIG. 2c, after the oxide film mask 12 is removed silicon is epitaxially grown over the whole major surface of the substrate 11 inclusive of the concaved dish-shaped portion 13 by feeding thereto $SiCl_4$ or $SiH_4$ or the like in gaseous phase. During the growth of silicon, the latter is doped with a donor such as phosphorus, arsenic or antimony at a low impurity concentration thereby to form an n-type epitaxial layer 15 as thick as 10$\mu$ to 20$\mu$. It is to be noted that a second dish-shaped portion 13' is formed in the surface of the n-type epitaxial layer 15 in correspondence with the dish-shaped portion 13. In other words, the layer 15 is imparted with the surface configuration which is substantially analogous or similar to that of the major surface of the substrate formed with dish-like concaved portion 13.

Figure 2D:
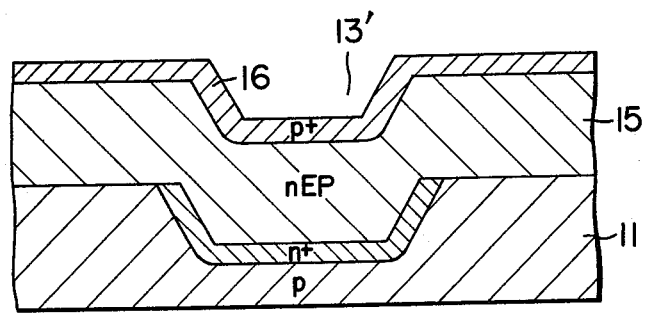

At the step d shown in FIG. 2d, the epitaxial layer 15 is doped with an acceptor impurity such as gallium (Ga) through diffusion over the whole surface, whereby a p$^+$-type diffusion layer 16 is formed in the surface of the epitaxial layer 15.

Figure 2E:
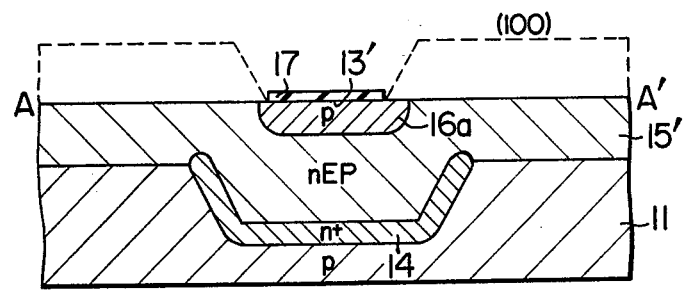
Figure 2F:
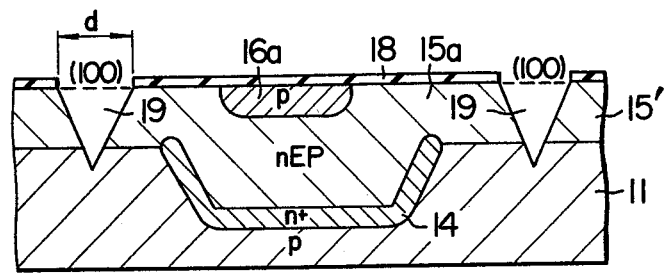

At the step e shown in FIG. 2e, the second dish-shaped concave portion 13' is provided with an oxide film 17 on its bottom. The oxide film 17 serves as a mask through which the anisotropic or usual etching or plasma etching is carried out so that the n-type epitaxial layer 15 is levelled to be flush with the plane A — A or the surface of the bottom of the second dish-shaped portion 13' on which the oxide film 17 is formed. As a result, the region 16 doped with Ga at the step (e) is limited to define a p$^+$-type diffusion region 16a.

At the step f shown in FIG. 4f, an oxide film 18 is formed on the surface of the flattened n-type epitaxial layer 15'. After a window has been formed in the oxide film 18 by etching, the epitaxial layer 15' and the surface portion of the substrate 11 are subjected to an anisotropic etching treatment to form a V-shaped groove 19 surrounding and defining an n-type epitaxial region 15a in the flattened n-type epitaxial layer 15' corresponding to the dish-shaped portion 14. The depth of the V-shaped groove 19 is dependent upon the aperture or diameter d of the upper portion of the groove or of the opened window and is at least so selected that the groove reaches that portion of the major surface of the p-type substrate 11 which is not recessed. Alternately, the provision of the V-shaped groove may be effected after the selective diffusion at the succeeding step g.

Figure 2G:
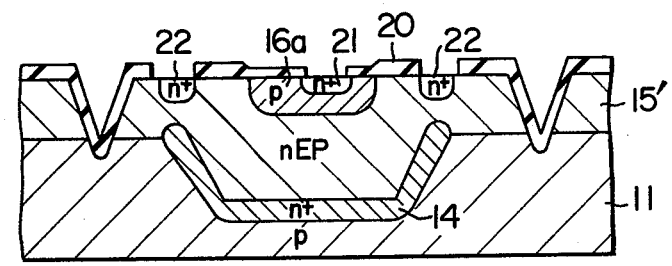

At the step g illustrated in FIG. 2g, through diffusion of an n-type impurity such as phosphorus, an n$^+$-type emitter region 21 is formed in the surface of the region 16a and at the same time an n$^+$-type collector leading region 22 is formed at a location adjacent to the n$^+$-type buried region 14. The collector leading region 22 may be realized in the form of an n$^+$-type diffusion portion 22' having a sufficient depth to communicate with the n$^+$-type buried region 14 through a separate diffusion of phosphorus (P).

Figure 2H:
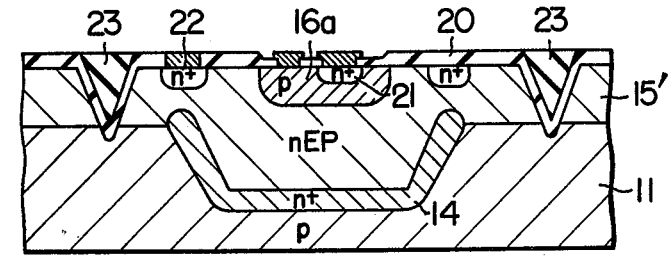

At the final step h illustrated in FIG. 2h, the V-shaped groove 19 is filled with an insulating material such as PIQ 23 (polyimide-iso-indroquinazolinedione—a polyimide resin), and the top surface of the resulting structure is flattened, whereby an isolation region is completed, and at least one dish-shaped island and at least one usual island having no recess, if necessary, are defined in the epitaxial layer 15'. Subsequently, aluminum wiring is effected for contact with the various semiconductor regions to form an npn-type power transistor. The isolation region 23 is so formed as to extend from the surface of the epitaxial layer 15' and reach the non-recessed surface of the substrate 11.

Figure 3:
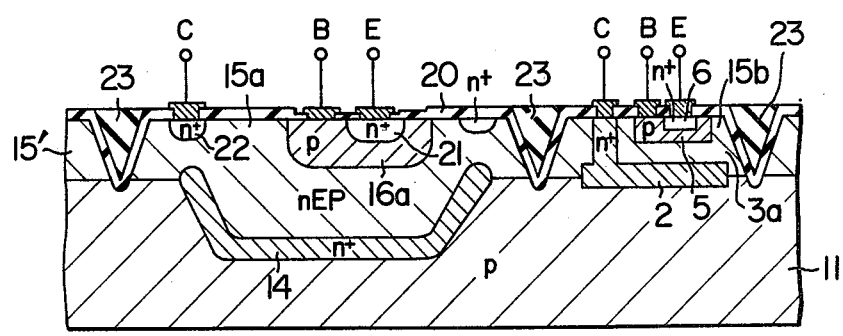
FIG. 3 is a sectional view of a finished semiconductor device manufactured through the application of the steps illustrated in FIGS. 2a to 2h.

In FIG. 3, a semiconductor device is shown in which an npn-type power transistor is formed in the dish-shaped island 15a in the substrate 11 through the steps described above together with an npn-type transistor formed in the usual, non-recessed island 15b in the substrate 11 and, having n$_+$-type emitter 6, p-type base 5, n-type collector 3a and n$^+$-type collector leading region 2, of a hitherto known structure adapted to deal with small amplitude signals, wherein the transistors are isolated from each other by V-shaped grooves filled with PIQ. For forming the base region of the latter transistor, boron (B) is diffused. The isolation region may be constituted by a semiconductor region forming a pn-junction in place of an insulation material as described above.

The semiconductor device constructed in accordance with the aforementioned Embodiment 1 enjoys the following advantages:

(1) Since the npn-type power transistor is incorporated in the n-type dish-shaped epitaxial island having a sufficient depth wherein the dish-shaped portion of the substrate is filled with the n-type epitaxial layer, the power transistor is rated to withstand a high voltage.

(2) Since the isolation region is implemented in the form of a V-shaped groove formed in the epitaxial layer at a thin portion thereof so as to surround the dish-shaped island, the tendency of the isolation region to expand laterally or transversely can be suppressed to a minimum, which in turn contributes to the enhancement of the integration density.

(3) The dish-shaped concave portion as well as the V-shaped groove may be easily formed within a relatively short time by adopting the anisotropic etching treatment.

(4) It is possible to simultaneously form different types of elements, respectively, at the dish-shaped island and the usual island having no recess in an epitaxial layer through a simultaneous diffusion process. For example, a power transistor capable of withstanding a high voltage may be formed in the dish-shaped island, while a transistor adapted to deal with small amplitude signals may be incorporated in the non-recessed usual island, through a series of diffusion steps.

(5) Usually, a silicon nitride ($Si_3N_4$) film has to be used as the mask for selective diffusion of Ga. However, in accordance with the above described embodiment, it is possible to form a Ga-diffused region without resorting to a $Si_3N_4$ mask by utilizing the second dish-shaped portion formed in the surface of the epitaxial layer. Use of a Ga-diffused region as the base region of an npn-type power transistor is advantageous in respect of the life time of minority carriers.

(6) The base of the power transistor is formed through diffusion of Ga, while the base of the transistor for dealing with small amplitude signals is formed separately by diffusing selectively boron (B). However, if the succeeding formation of emitter regions through the diffusion of phosphorus (P) is effected concurrently for both the power and the small amplitude signal transistors, the width of the base region for the power transistor is relatively large, resulting in an increase in $h_{FE}$ and breakdown strength or the withstanding voltage.

EMBODIMENT 2

FIGS. 4a to 4d illustrate manufacturing steps of a high voltage rated power IC device in which elements constituting the IC device are isolated from one another through electric insulation.

Figure 4A:
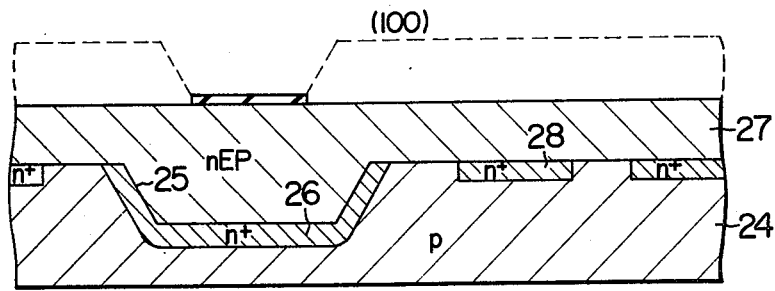
FIGS. 4a to 4d are sectional views showing various steps of the manufacture of a semiconductor device according to another embodiment of the invention.

At the step a shown in FIG. 4a, a dish-shaped concave portion 25 is formed in the surface of a p-type substrate 24, an $n^+$-type buried region 26 is formed in the surface of the dish-shaped portion 25 and an $n^+$-type epitaxial region 26 is formed on the substrate 24 as well as on the buried region 26, filling the dish-shaped portion 25 in accordance with the processes described above in conjunction with the steps a, b, c, d and e of the Embodiment 1. Additionally, $n^+$-type buried regions 28 are formed through a usual diffusion process in other portions of the major surface of the substrate 24 and covered with the epitaxial layer 27.

Figure 4B:
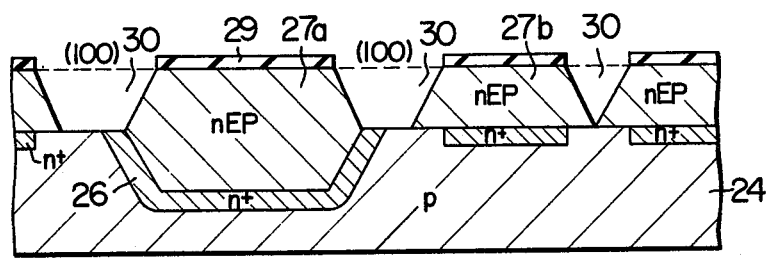

At the step b shown in FIG. 4b, an oxide film 29 is formed on the whole surface of the flattened epitaxial layer 26 and is partially etched to form windows. Then, the n-type epitaxial silicon layer 27 is anisotropically etched by using the oxide film 29 with windows as a mask thereby to form V-shaped grooves 30. As can be seen, some grooves expose the end surfaces of the $n^+$-type epitaxial regions 26 while some grooves expose other, unrecessed portions of the major surface of the substrate 24. Thus, there are defined in the n-type epitaxial layer 27 an n-type dish-shaped island 27a and a usual island 27b which are isolated from each other.

Figure 4C:
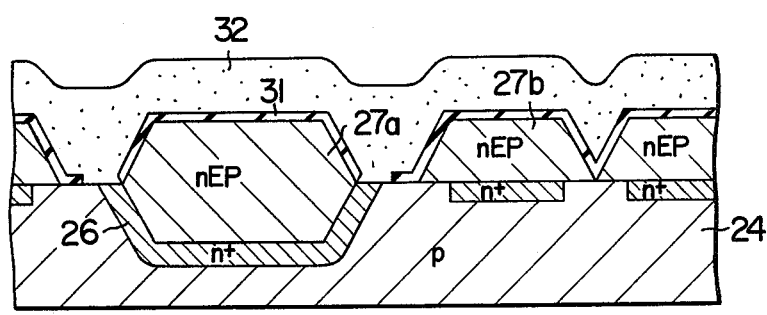

At the step c shown in FIG. 4c, an oxide film 31 is formed over the whole surface of the islands inclusive of the bottoms of the V-shaped grooves. The film 29 shown in FIG. 4b may or may not constitute the top flat portions of the film 31. After windows having been formed through those portions of the oxide film 31 which overlie the end surfaces of the $n^+$-type buried regions 26 by selective etching of the oxide film 31, a polycrystal silicon layer 32 is formed over the whole surface of the resulting structure through epitaxial growth to a thickness of, for example, 20 to 30$\mu$.

Figure 4D:
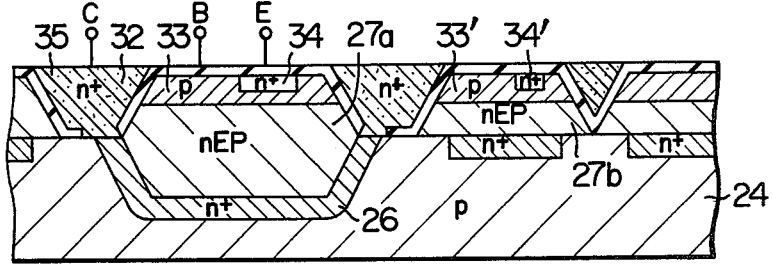

At the step d illustrated in FIG. 4d, the top surface of polycrystal silicon layer 32 is levelled or flattened through usual etching or plasma etching. Subsequently, the oxide film 31 is partially etched away to form windows at the n-type epitaxial islands 27a and 27b and then base region 33 as well as another p-type region 33' is formed by diffusing a p-type impurity through the mask of the partially etched oxide film 31. Thereafter, emitter regions 34 and 34' are formed in the base regions 33 and 33' through selective diffusion of an n-type impurity and at the same time a collector leading portion 35 is formed with the polycrystal silicon at the portion in contact with the $n^+$-type buried region. In this manner, an npn-type power transistor has been constructed in the dish-shaped n-type epitaxial island 27a which fills the dish-shaped concave portion, while other elements are implemented in other islands 27b et al.

The semiconductor device manufactured in accordance with the Embodiment 2 enjoys the following advantages:

(1) In the hitherto known manufacturing process of the semiconductor device of this type (EPIC-structure), the silicon substrate tends to be bent due to the formation of a polycrystal silicon layer 300 to 400$\mu$ thick thereon. However, according to the invention, the thickness of the polycrystal silicon layer may be decreased by the depth of the dish-shaped portion, i.e., to a thickness of 20 to 30$\mu$ without incurring the bending of the substrate.

(2) When a power transistor carrying a large current is isolated with a surrounding oxide film, there arises a problem about dissipation of heat produced by the transistor. However, according to the invention, the heat dissipation is conveniently effected by way of the bottom portion of the transistor structure formed in the dish-shaped island. That is, since silicon has a thermal conductivity 100 times as great as that of an oxide film ($SiO_2$), influence of heat generated by the power transistor to the elements disposed around the isolated power transistor can be effectively obviated. Besides, the use of the oxide film for the electrical isolation allows a positive prevention of sidewise leakage of current.

(3) Due to the anisotropic etching of silicon exhibiting a masking effect in which rather a wide flat bottom portion is available, a large collector current is allowed to stably flow in the power transistor.

(4) Since the pn-junction formed by the formation of the base region through diffusion can be formed plain or almost parallel with the surface of the device, a high rated collector voltage can be used.

(5) Since the diffusion rate of phosphorus (P) in a polycrystal silicon can be made 10 times as great as the diffusion rate in a single crystal silicon by correspondingly selecting growth conditions, the diffusion of an n-type impurity for forming the collector region can be accomplished within a relatively short time.

(6) The anisotropic etching of silicon permits the formation of the V-shaped groove of a small width for the electrical isolation, which in turn contributes to the enhancement of the integration density of the IC device.

EMBODIMENT 3

FIG. 5 shows a semiconductor device in which two npn-type elements having the same characteristics are formed on a p-type substrate, the active elements being electrically isolated by pn-junctions. The manufacturing process is simplified and at the same time the integration density is enhanced, as described below.

In FIG. 5, $n^+$-type buried regions 37 are formed in the surface of the dish-shaped concave portions of a p-type substrate 36. Flattened epitaxial islands 38 of n-type are formed on the dish-shaped portions, in which p-type diffusion regions 39 are formed constituting the base regions. The members or constituents mentioned above are all formed in the manner described above in conjunction with FIGS. 2a to 2e. In order to define islands 38, $p^+$-type diffusion regions 40 serving as insulation regions are formed simultaneously with or separately from the formation of the p-type diffusion regions 39. The $n^+$-type diffusion regions 41 serve as emitters, while the $n^+$-type regions 42 provided close to the upper edge portion of the $n^+$-type buried regions 37 serve to lead out the collectors. These n-type regions may be formed simultaneously through selective diffusion of an n-type impurity.

Figure 7A:
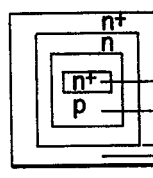
FIGS. 7a and 7b are plan views to illustrate integration density attained in a semiconductor device according to the invention in comparision with that of a prior art semiconductor device.
Figure 7B:
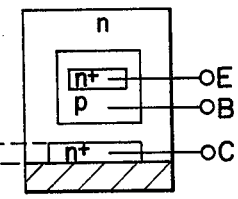

The above described semiconductor device enjoys the following advantages:

(1) In a power IC device heretofore fabricated using pn junction isolation, in which active elements are formed in an n-type epitaxial layer and isolated from each other by means of $p^+$-type regions formed through diffusion of a p-type impurity. In this connection, considering the extension of the depletion layers and tolerance required for the mask registration, the distance D between the $p^+$-type isolation regions and the base regions of the elements has to be at least about $90\mu$. In the present invention, however, since the base region can be formed with a sufficient depth at the dish-shaped island, as schematically partially illustrated in FIG. 6 again, the distance D between the base regions 39' of the elements formed in the epitaxial layer 38' and the respective $p^+$-type isolation regions 40' may be selected shorter in the order of 10 to $30\mu$. The broken lines in FIG. 6 show depletion layers concerning the regions 39' and 40'. Further, as can be seen from FIGS. 7a and 7b, the $n^+$-type collector leading region lies inside the isolated island in the case of the conventional device (FIG. 7b). However, in accordance with the invention (FIG. 7a), the $n^+$-type collector leading region is formed in such a manner as to surround the element, as a result of which the integration density can be increased by an amount corresponding to the hatched area in FIG. 7b.

(2) In the case of the hitherto known semiconductor device of a similar type, a lot of time is required for the diffusion of a p-type impurity for forming the isolation regions between active elements as well as for the diffusion of an n-type impurity for forming the collector leading regions. Accordingly, the diffusion processes for these regions have to be individually conducted separately from the diffusion of p-type and n-type impurities for forming the $p^+$-type base regions and $n^+$-type emitter regions. However, according to the invention, the diffusions of the same type impurities can be carried out simultaneously without requiring a lot of time, whereby the fabricating steps can be simplified and reduced in number.

(3) Since the region in which the element is formed encompasses therein the dish-shaped region portions of the surface of a substrate, the n-type epitaxial layer formed on the recessed substrate can be relatively thin as a whole. Besides, the dish-shaped portion itself is sufficient to have a reasonable depth (e.g., about 20 to $50\mu$ when the substrate is about $300\mu$ thick). These features will involve an increased dimensional accuracy and hence an enhanced integration density.

(4) due to such arrangement that the $n^+$-type collector leading portion and the $n^+$-type buried region are in a complete contiguity with each other in a box-like configuration, thereby to serve as a channel stopper, a high stability and reliability of the device can be assured.

EMBODIMENT 4

FIG. 8 shows an integrated circuit device incorporating therein an npn-type power transistor of which the collector series resistance is lowered significantly.

In FIG. 8, reference numeral 43 designates a p-type silicon substrate 43, in the major surface of which a dish-shaped concave portion 45 is formed. An $n^+$-type buried layer 44 having a sufficient depth $d_1$ in the order of $50\mu$ is formed in the surface of the dish-shaped portion through diffusion of phosphorus (P). An n-type silicon epitaxial layer 46 is formed on the surface of the substrate inclusive of the buried layer 44 and flattened at its top surface. There are formed in the n-type epitaxial layer 46 $p^+$-type isolation regions 54 to define islands 46a, 46b, etc. In the island 46a overlying the buried layer 44 there are formed a base region 47 through diffusion of a p-type impurity, an emitter region 48 through diffusion of an n-type impurity into the region 47 and a collector leading portion 49 through diffusion of an n-type impurity which portion is in contact with the $n^+$-type buried layer 44, whereby a power transistor is constituted. Another $n^+$-type buried layer 50 having a width of $d_2$ in the order of 6 to $10\mu$ is formed in that portion of the major surface of the p-type substrate 43 through the diffusion of As or Sb which does not include the dish-shaped portion. In the n-type epitaxial island 46b overlying the buried layer 50, there are formed a base region 51 through diffusion of an n-type impurity, an emitter region 52 through diffusion of an n-type impurity and a collector leading portion 53 through diffusion of an n-type impurity whereby a small amplitude signal transistor is constituted.

The semiconductor device described above enjoys the following advantages:

In the case of a conventional linear IC device, since the diffusion of an n-type impurity for the formation of the N+-type buried layer is carried out with the epitaxial layer of a uniform thickness as shown in FIG. 1, an impurity such as antimony (Sb), arsenic (As) or the like which has a small diffusion constant must be employed with a view to obviating the out diffusion of the n-type impurity from the buried region during, for example, other diffusion steps and attaining a low resistivity of the buried layer. Further, when phosphorus (P) is to be deposited for forming the n+-type collector leading portion extending to the n+-type buried region 2, it is impossible to fabriate an IC device which is capable of withstanding a high voltage, since phosphorus will be undesirably out-diffused to the collector region. In contrast, in the case of the power transistor fabricated in accordance with the teaching of the invention, it is possible to decrease the collector series resistance by one order of magnitude as compared with the hitherto known structure, since the sheet resistance of the n+-type buried layer can be reduced significantly. The reason for such advantageous effects will be described by referring to FIG. 9. The collector series resistance $r_{CS}$ can be represented as follows:

$$r_{CS} = r_1 + r_2 + r_3$$

The component resistance $r_1$ is determined inherently by the characteristic of the element and remains unvaried. In general, $r_2 \gg r_3$, wherein $r_2$ is determined by the sheet resistance $\rho_S$ of the buried region 44. In the case of the n+-type buried diffusion layer doped with Sb or As the sheet resistance $\rho_S$ is in the range of 20 to 25 $\Omega/cm^2$, while in the case of the buried diffusion layer doped with phosphorus (P), the sheet resistance $\rho_S$ is in the range of 0.5 to 1 $\Omega/cm^2$. Accordingly, $r_2(P)/r_2(Sb)$ + 1/20 to 1/50.

The diffusion of an n-type impurity for forming the n+-type collector leading region 49 may be effected from both the upper and lower surfaces of the epitaxial layer 46. When the surface concentration of the diffused n-type impurity of the n+-type buried layer is not greater than $1 \times 10^{19}$ Atoms/cm², mass production of the device is possible by using phosphorus (P), arsenic or antimony.

EMBODIMENT 5

FIG. 10 shows an application of the present invention to the fabrication of IC device including a logic circuit shown in FIG. 11. A typical example of the logic circuit is found in U.S. Pat. No. 3,736,477 issued on May 29, 1973 and assigned to International Business Machines Corporation. In FIG. 10, an npn-type transistor rated for a high voltage and elements such as an I²L (or ECL) structure are formed in one and the same semiconductor chip.

In a similar manner as described hereinbefore; a p-type substrate 55 is provided with a dish-shaped portion 56 at its major surface in which a buried region 57 of n+-type is formed through the diffusion, a flattened epitaxial layer 62' including a dish-shaped n-type epitaxial island 58a overlying the buried layer 57 and another n-type island 58b of a usual shape is formed on the substrate 55, and there are formed in the island 58a a p+-type diffused base region 59, an n+-type diffused emitter region 60 and an n+-type diffused portion 61 for leading out collector, which constitute together a high voltage rated npn-transistor.

On the other hand the I²L element is formed in another epitaxial island 58b of n-type. A p-type base region 62 of the I²L element (inverse transistor) is formed by the implantation of p-type impurity ions into that region of the island 58b which is indicated by d thereby to invert the conductivity thereof into p-type. The diffusion of an n-type impurity for forming emitter regions 63 (actually serving as the collectors $C_1$ and $C_2$) and a region 64 for leading out a collector (actually, emitter) region constituted by an n+-type buried region 57' can be effected simultaneously with the diffusion of the n-type impurity during the formation of the regions 60 and 61 of the power transistor. The isolation regions of p-type between the elements can be formed through the selective implantation and diffusion of p-type impurity ions and a p-type impurity. Reference numerals 64' and 64" designate a p+-type base leading region and a p+-type injection region, respectively.

According to the prior art, however, an I²L element and an npn-type transistor which are to be incorporated in one and the same chip are formed in an n-type epitaxial layer 3' of a uniform thickness as shown in FIG. 12, which not only gives rise to a problem in the operation of the device but also provides difficulty in the implementation of a high voltage rated element. However, such disadvantages can be evaded by virtue of the provision of the dish-shaped portion in accordance with the present invention. Additionally, the following desirable effects can be attained:

(1) The base region of the I²L element is made to have a uniform impurity concentration through the ion implantation, whereby $h_{FE}$ of the npn-type inverse transistor can be increased. This means that the impurity concentration in the emitter region can be increased to enhance the carrier injection efficiency.

(2) The factor $h_{FE}$ of the high voltage rated transistor can be set independently from various characteristics of the I²L element.

(3) Since the width of the base region can be enlarged for a given $h_{FE}$, the device may be fabricated with a high yield.

(4) The diffusion of an n-type impurity can be effected simultaneously for forming the relevant regions of both the transistor element and I²L element, whereby the number of processing steps may be decreased as compared with the prior art processes.

It will be further noted that high speed ECL elements and a high voltage rated transistor in combination with isoplanar elements disclosed, for example, in U.S. Pat. No. 3,648,125 issued on Mar. 7, 1972 and assigned to Fairchild Camera And Instrument Corporation may be incorporated in one and the same semiconductor chip.

EMBODIMENT 6

Figure 13:
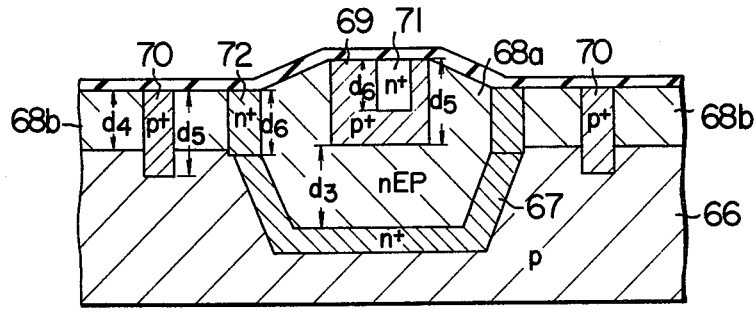
FIG. 13 is a sectional view showing a semiconductor device according to another embodiment of the invention.
Figure 14:
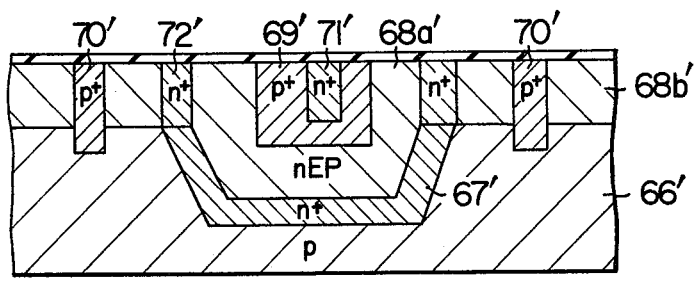
FIG. 14 is a sectional view of a modification of the device shown in FIG. 13.

FIG. 13 shows a structure of a linear IC device which is capable of withstanding a high voltage and can be manufactured inexpensively with a decreased number of the processing steps. In this embodiment, an epitaxial layer is formed partially much thicker at a dish-shaped portion of the surface of a substrate thereby to allow simultaneous diffusion for forming a base region and an isolation region as well as simultaneous diffusion for forming an emitter region and a collector leading portion.

In FIG. 13, reference numeral 66 denotes a p-type silicon substrate, 67 and n+-type buried region, and 68a denotes a region constituting the collector of an npn-power transistor in an n-type island overlying the dish-shaped concave portion having a depth $d_3$ of about 30 $\mu$. Reference numeral 68b designates other n-type epitaxial islands of about 40 μ in thickness ($d_4$) formed on the p-type substrate 66. The abovementioned regions or constituents may be formed in the same manner as the preceding examples, except that the etching of an n-type epitaxial layer on the substrate 66 is made in such a manner that the dish-shaped island 68a portion is protruding or at a higher level than the other portions. Numeral 69 denotes a p+-type region having a depth or thickness $d_5$ of 18 μ and destined to serve as the base of the pnp-type power transistor. This region 69 may be formed through the simultaneous diffusion of a p-type impurity for forming a p+-type isolation region 70 to isolate the island 68a from the n-type epitaxial islands 68b. An n+-type region 71 having a depth or thickness $d_6$ of 12 μ and destined to serve as the emitter is formed simultaneously with the collector leading portion 72 through a diffusion process of an n-type impurity.

In the embodiment shown in FIG. 13, the n-type epitaxial island 68a on the dish-shaped portion is somewhat protruding relative to the other islands 68b, it is of course possible to make flat the whole surface of the epitaxial layer by selecting a sufficient depth for the dish-shaped portion.

The semiconductor device according to Embodiment 6 enjoys the following advantages:

(1) The depth or the thickness of the base region of the power transistor can be selected to a large value such as in the order of 6 μ by using the dish-shaped structure which allows a large base current.

(2) For the same reason as above, the device can be rated for a high voltage. For example, the voltage $V_{CBO}$, which was conventionally 100 volts, can be raised to 300 volts.

(3) The impurity diffusions for the formation of the base and the emitter regions may be carried out in common for the formation of the isolation region and the collector leading portion, respectively, whereby the processing steps can be decreased in number.

(4) A relatively large freedom of the design of a power transistor can be assured with a result that the area of safety operation can be correspondingly enlarged. This is due to the fact that the base width or the base thickness of the power transistor can be selected independently from that of a small amplitude signal transistor incorporated along with the power transistor in a single chip.

EMBODIMENT 7

FIGS. 15a to 15f show manufacturing steps of a complimentary IC device including junction type field-effect transistors having p- and n-channels having a high performance capability on the basis of the linear IC process in accordance with the teaching of the invention. This structure of the IC has not been reported. They are usually fabricated as a discrete devices through the epitaxial process, selective oxidization process or double diffusion process.

Figure 15A:
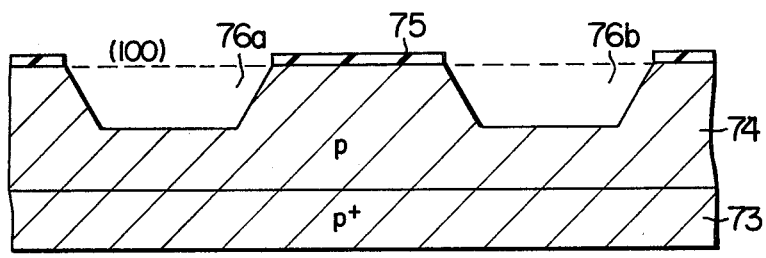
FIGS. 15a to 15f illustrate manufacturing steps of a semiconductor device in accordance with another embodiment of the invention.

At the step *a* shown in FIG. 15a, a p+p-type silicon substrate consisting of a p+-type layer 73 and a p-type layer 74 and having its major surface in a crystal plane (100) is prepared. The surface of the p-type layer 74 is provided with an oxide film 75 and thereafter a dish-shaped concave portions 76a and 76b are formed by a photoresist treatment and anisotropic etching described hereinbefore.

Figure 15B:
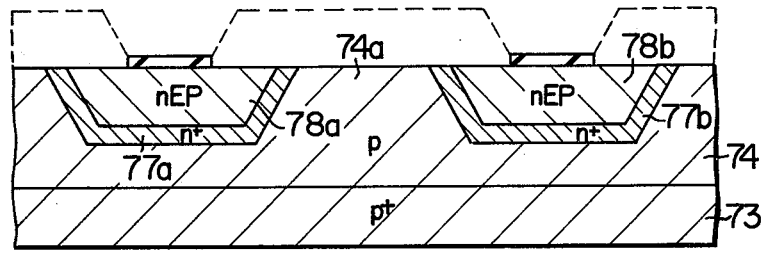

At the step *b* shown in FIG. 15b, n+-type buried regions 77a and 77b are formed in the surfaces of the dish-shaped concave portions through diffusion of an n-type impurity. Subsequently, n-type dish-shaped epitaxial regions 78a and 78b are formed on the dish-shaped concave portions through epitaxial silicon growth, oxidization and an etching treatment for surface flattening.

Figure 15C:
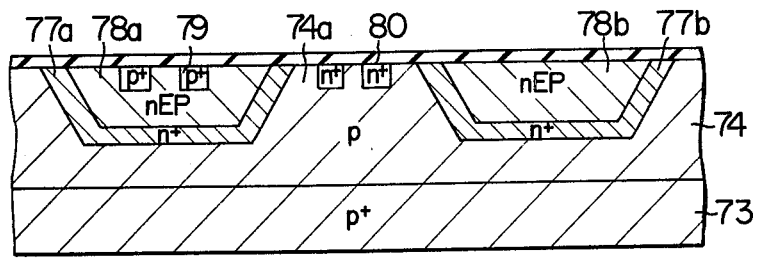

At the step *c* shown in FIG. 15c, a surface oxidation mask film is formed and subsequently an n+-type gate region 80 is formed through selective diffusion of an n-type impurity in the surface portion 74a of the p-type layer 74 at which no dish-shaped portion is present. Thereafter, a p+-type gate region 79 is formed through selective diffusion of a p-type impurity in the surface of the epitaxial region 78a lying over one of the dish-shaped portions.

Figure 15D:
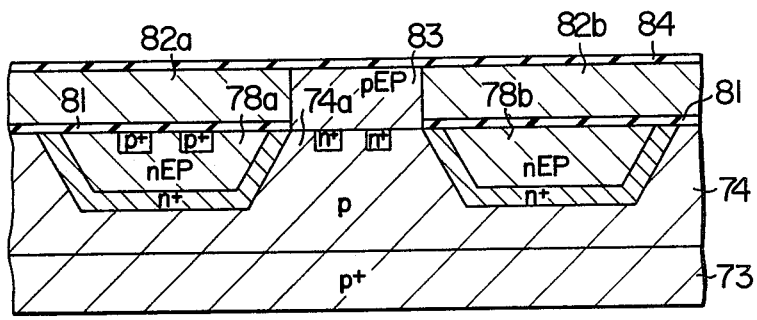

At the step *d* shown in FIG. 15d, the surface oxidation film is selectively etched so that only that portion of the oxidation film which overlies the surface portion 74a of the p-type layer 74 is removed with oxide films retained as indicated by 81, and silicon is grown in vapor phase over the whole surface of the resulting structure to form polycrystal silicon layers 82a and 82b on the oxide films 81 and a p-type monocrystal epitaxial layer 83 on the region 74a of the p-type substrate in which the n+-type gate region has been formed. Next an oxide film 84 is formed on the surfaces of the layers 82a, 82b and 83 by, for example, CVD method.

Figure 15E:
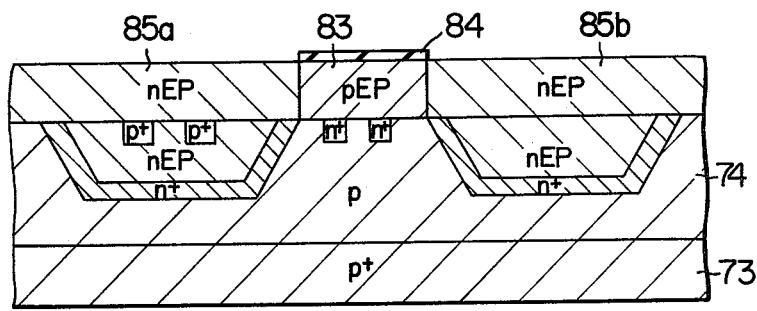

At the step *e* illustrated in FIG. 15e, the oxide film 84 is selectively etched so that it remains only on the pitaxial layer 83. With the thus selectively etched oxide film 84 used as a mask the polycrystal layers 82a and 82b are etched away. Then, n-type epitaxial layers 85a and 85b are formed to the level of the p-type epitaxial layer 83. The epitaxial layers 83, 85a and 85b thus formed are made about 5 μ thick but are variable depending on the gate voltage to be rated, while the resistivity of the p-type epitaxial layer 83 is in the order of 1 to 2 Ωcm.

Figure 15F:
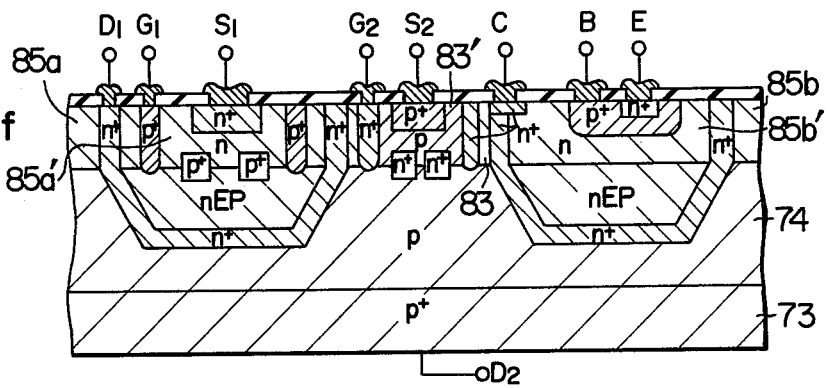

At the step *f* shown in FIG. 15f, a p+-type diffused gate leading portion $G_1$, an n+-type diffused source region $S_1$ and n+-type diffused drain leading portion $D_1$ are formed in the n-type epitaxial region 85a' to which the n+-type gate regions are extended as a result of out diffusion. On the other hand, n+-type diffused gate leading portion $G_2$ and a p+-type diffused source $S_2$ are formed in the p-type epitaxial region 83' to which the p+-type gate region is extended as a result of out diffusion. It is noted that the p+-type layer 73 of the substrate constitutes a drain leading portion $D_2$. Additionally, a p+-type diffused base region B, an n+-type diffused emitter region E and an n+-type diffused collector leading portion C are formed in the n-type epitaxial region 85'b in which no n+-type gate region is formed, whereby n-channel JFET, p-channel JFET and an npn-type transistor are formed in a single substrate.

The above described embodiment enjoys the following advantages:

(1) By the anisotropic etching technique, it is possible to selectively form an n-type epitaxial layer and a p-type epitaxial layer in a single substrate.

(2) The drain for the p-channel JFET can be advantageously led out through the p+-type substrate in the case where the n-channel and the p-channel JFETs are employed in a source-follower configuration at an output stage. This leads to an enhancement of the freedom of design.

It will be appreciated from the foregoing description that the present invention may be applied to all the integrated circuits including high voltage rated power ICs, bipolar ICs, logic ICs or the like.

We claim:
1. A semiconductor device capable of withstanding a high voltage comprising:
   a semiconductor substrate of a first conductivity type, one major surface of said substrate being partly recessed to form at least one dish-shaped portion;
   a low resistivity region of a second conductivity type formed in the surface of said dish-shaped portion of said one major surface of said substrate;
   a semiconductor layer of said second conductivity type formed on said one major surface of said substrate and on said low resistivity region and having a plain surface, said low resistivity region being buried in said substrate and in said semiconductor layer; and
   at least one isolation region formed in said semiconductor layer, said isolation region extending from the surface of said semiconductor layer to reach that portion of said one major surface of said substrate which is not recessed, thereby defining at least one isolated dish-shaped island in said semiconductor layer;
   wherein said dish-shaped island includes a bipolar transistor having a first base region of said first conductivity type in a first portion of the surface of said dish-shaped island in said semiconductor layer, a first emitter region of said second conductivity type formed in the surface of said base region, and a first collector leading region formed in a second portion of the surface of said dish-shaped island, the remaining portion of said dish-shaped island serving as a collector region;
   in which said collector leading region extends to be in contact with said buried low resistivity region.

2. A semiconductor device according to claim 1, in which said semiconductor layer further includes at least one isolated usual island having no recess, said usual island including another bipolar transistor having a second base region of said first conductivity type formed in a first portion of the surface of said usual island in said semiconductor layer, a second emitter region of said second conductivity type formed in the surface of said second base region, and a second collector leading region formed in a second portion of the surface of said usual island, the remaining portion of said usual island serving as a collector region.

3. A semiconductor device according to claim 1, in which said semiconductor layer further includes at least one isolated usual island where a pn junction diode is formed.

4. A semiconductor device capable of withstanding a high voltage comprising:
   a semiconductor substrate of a first conductivity type, one major surface of said substrate being partly recessed to form dish-shaped portions;
   a low resistivity region of a second conductivity type formed in the surface of each of said dish-shaped portions of said one major surface of said substrate;
   a dish-shaped semiconductor region of said second conductivity type formed on each of said low resistivity regions;
   a first semiconductor region of said second conductivity type formed on each of said dish-shaped semiconductor regions;
   a second semiconductor region of said first conductivity type formed on each of those portions of said one major surface which are not recessed;
   a first gate region of said first conductivity type formed in spaced relationship in the boundary between one of said dish-shaped region and the first semiconductor region on said one dish-shaped region, said one dish-shaped region and said first semiconductor region on said one dish-shaped region serving as a drain and a source to constitute along with said first gate region a junction type FET;
   a second gate region of said second conductivity type formed in spaced relationship in the boundary between one of said second semiconductor regions and said semiconductor substrate, said one second semiconductor region and said substrate serving as a source and a drain to constitute along with said second gate regions another junction type FET; and
   a base region of said first conductivity type formed in a first portion of the surface of another one of said first semiconductor region and an emitter region of said second conductivity type formed in the surface of said base region and a collector leading region formed in a second portion of the surface of said another first semiconductor region, the remaining portion of said another first semiconductor region and the dish-shaped semiconductor region underlying said another first semiconductor region serving as a collector to constitute along with said base and emitter regions a bipolar transistor.

5. A method of manufacturing a semiconductor device capable of withstanding a high voltage, comprising the steps of:
   forming at least one dish-shaped portion in one major surface of a semiconductor substrate of a first conductivity by etching;
   doping the surface portion of said dish-shaped portion to form a first high impurity concentration region of a second conductivity type;
   epitaxially growing a semiconductor layer of said second conductivity layer on said one major surface of said substrate and on said first high impurity concentration region, the surface of said epitaxial grown layer being almost analogous to said one major surface of said substrate having said dish-shaped portion, said first high impurity concentration region being buried in said substrate and in said epitaxially grown layer;
   selectively etching said epitaxial layer to make its surface plain;
   forming at least one isolation region extending from the surface of said epitaxial layer to reach that portion of said one major surface of said substrate which is not recessed, thereby defining at least one dish-shaped island in said epitaxial layer; and
   performing successive operations of selectively doping said dish-shaped island to form active regions therein, one of said active regions in said dish-shaped island being in contact with said buried first high impurity concentration region.

6. A method according to claim 5, further comprising the steps of doping said epitaxial layer to form a high impurity concentration region of said first conductivity type in the whole surface of said epitaxial layer before said selective etching step, that portion of said high impurity concentration of said first conductivity type which is directly above said first high impurity concentration region being retained by said selective etching to form a second high impurity concentration region of said first conductivity type.

7. A method according to claim 5, in which after said selective etching step said epitaxial layer is subjected to anisotropic etching to form V-shaped grooves therein, then said grooves are filled with polycrystal silicon, and the polycrystal silicon in at least one of said grooves is doped by one of said selective doping operations to make said polycrystal silicon in said at least one groove conductive, the polycrystal silicon in said at least one groove being in contact with said buried first high impurity concentration region.

8. A method according to claim 5, in which said formation of said at least one dish-shaped portion is effected by anisotropic etching.

9. A method of manufacturing a semiconductor device capable of withstanding a high voltage, comprising the steps of:
  forming at least one dish-shaped portion in one major surface of a semiconductor substrate of a first conductivity type by anisotropic etching;
  doping the surface portion of said dish-shaped portion to form a first high impurity concentration region of a second conductivity type;
  epitaxially growing a semiconductor layer of said second conductivity layer on said one major surface of said substrate and on said first high impurity concentration region, the surface of said epitaxial grown layer being almost analogous to said one major surface of said substrate having said dish-shaped portion, said first high impurity concentration region being buried in said substrate and in said epitaxially grown layer;
  doping said epitaxial layer to form a high impurity concentration region of said first conductivity type in the whole surface of said epitaxial layer;
  etching said epitaxial layer to make its surface plain thereby to definitively form a second high impurity concentration region by retaining that portion of said high impurity concentration region of said first conductivity type which is directly above said first high impurity concentration region; and
  forming at least one isolation region extending from the surface of said epitaxial layer to reach that portion of said one major surface of said substrate which is not recessed, thereby defining at least one dish-shaped island in said epitaxial layer.

10. A method according to claim 8, further comprising the steps of forming a base region of said first conductivity type in a first portion of the surface of one dish-shaped island in said epitaxial layer, forming an emitter region of said second conductivity type formed in the surface of said base region, and forming a collector leading region in a second portion of the surface of said one dish-shaped island, the remaining portion of said one dish-shaped region serving as a collector region, whereby a bipolar transistor is constituted.

11. A method of manufacturing a semiconductor device capable of withstanding a high voltage, comprising the steps of:
  forming two dish-shaped portions in one major surface of a semiconductor substrate of a first conductivity type by anisotropic etching;
  doping the surface portions of said dish-shaped portions to form high impurity concentration regions of a second conductivity type;
  epitaxially growing a semiconductor layer of said second conductivity type on said one major surface of said substrate and on said high impurity concentration regions, the surface of said epitaxial layer being almost analogous to said one major surface of said substrate having said dish-shaped portions, said first high impurity concentration regions being buried in said substrate and in said epitaxial layer;
  etching said epitaxial layer to the level of said one major surface of said substrate to make the surface of said epitaxial layer plain and to form dish-shaped regions on said high impurity concentration regions;
  forming a first gate region of said first conductivity type in the surface of one of said dish-shaped regions and a second gate region of said second conductivity type in the surface of said substrate;
  epitaxially growing first semiconductor regions of said second conductivity type on said dish-shaped regions and a second semiconductor region on that portion of said one major surface of said substrate which includes said second gate region, said first and second gate regions being subjected to out-diffusion due to this epitaxial growth, said one dish-shaped region and one of said first semiconductor regions overlying said one dish-shaped region serving as a drain and a source while said second semiconductor region and said substrate serving as another source and another drain, whereby complementary FETs are constituted;
  forming a base region of said first conductivity type in the surface of one of said first semiconductor regions overlying the other dish-shaped region;
  forming an emitter region of said second conductivity type in the surface of said base region, the remaining portion of said one first semiconductor region and said other dish-shaped region serving as a collector whereby a bipolar transistor is constituted; and
  forming isolation regions extending from the surface of said semiconductor regions to reach those portions of said one major surface of said substrate which are not recessed.

* * * * *